(12) United States Patent
Soeno (10) Patent No.: US 8,384,211 B2
(45) Date of Patent: Feb. 26, 2013

(54) SEMICONDUCTOR APPARATUS WITH IMPROVED EFFICIENCY OF THERMAL RADIATION

(75) Inventor: Akitaka Soeno, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 67 days.

(21) Appl. No.: 12/990,681

(22) PCT Filed: Apr. 30, 2009

(86) PCT No.: PCT/JP2009/058507
§ 371 (c)(1),
(2), (4) Date: Nov. 2, 2010

(87) PCT Pub. No.: WO2009/136591
PCT Pub. Date: Nov. 12, 2009

(65) Prior Publication Data
US 2011/0049535 A1    Mar. 3, 2011

(30) Foreign Application Priority Data
May 8, 2008    (JP) .................................. 2008-122296

(51) Int. Cl.
*H01L 23/10*    (2006.01)
(52) U.S. Cl. .. 257/707; 257/702; 257/723; 257/E23.092
(58) Field of Classification Search .................. 257/702, 257/707, 723, E23.092
See application file for complete search history.

(56) References Cited

U.S. PATENT DOCUMENTS

| | | | |
|---|---|---|---|
| 5,305,186 A * | 4/1994 | Appelt et al. ................. | 361/704 |
| 6,373,705 B1 * | 4/2002 | Koelle et al. .................. | 361/720 |
| 6,670,687 B2 * | 12/2003 | Satoh et al. .................... | 257/471 |
| 6,914,321 B2 * | 7/2005 | Shinohara ...................... | 257/678 |
| 7,149,088 B2 * | 12/2006 | Lin et al. ........................ | 361/704 |
| 7,318,547 B2 * | 1/2008 | Gasse ............................. | 228/247 |
| 7,760,503 B2 * | 7/2010 | Aoki et al. ..................... | 361/699 |
| 8,018,056 B2 * | 9/2011 | Hauenstein .................... | 257/730 |
| 2004/0007772 A1 | 1/2004 | Arai et al. | |

FOREIGN PATENT DOCUMENTS

| | | |
|---|---|---|
| JP | 4 93159 | 8/1992 |
| JP | 11 121691 | 4/1999 |
| JP | 2003 60137 | 2/2003 |
| JP | 2004 47883 | 2/2004 |

(Continued)

OTHER PUBLICATIONS

International Search Report issued Aug. 4, 2009 in PCT/JP09/058507 filed Apr. 30, 2009.

(Continued)

*Primary Examiner* — John C Ingham
(74) *Attorney, Agent, or Firm* — Oblon, Spivak, McClelland, Maier & Neustadt, L.L.P.

(57) ABSTRACT

A semiconductor apparatus includes a first stacked body including a first radiator plate, a first insulating layer, a first conductive layer and a first semiconductor element in this order; a second stacked body including a second radiator plate, a second insulating layer, a second conductive layer and a second semiconductor element in this order and configured to be made of a semiconductor material different from that of the first semiconductor element; and a connecting part configured to electrically connect the first conductive layer and the second conductive layer, wherein the first stacked body and the second stacked body are thermally insulated.

15 Claims, 10 Drawing Sheets

FOREIGN PATENT DOCUMENTS

| | | |
|---|---|---|
| JP | 2004 95670 | 3/2004 |
| JP | 2004 221381 | 8/2004 |
| JP | 2005 5593 | 1/2005 |
| JP | 2005 159024 | 6/2005 |
| JP | 2005 276968 | 10/2005 |
| JP | 2006 210605 | 8/2006 |
| JP | 2008 60430 | 3/2008 |
| JP | 2008-061374 | 3/2008 |
| JP | 2008 228398 | 9/2008 |
| KR | 10-2002-0051468 | 6/2002 |

OTHER PUBLICATIONS

Korean Office Action issued Mar. 23, 2012, in Korea Patnet Application No. 2010-7024882 (with English translation).

Office Action mailed Oct. 23, 2012 in Japanese Application No. 2008-122296 filed May 8, 2008.

* cited by examiner

SEMICONDUCTOR APPARATUS WITH IMPROVED EFFICIENCY OF THERMAL RADIATION

TECHNICAL FIELD

The present invention relates to a semiconductor apparatus including a plurality of semiconductor elements which improves efficiency of thermal radiation.

BACKGROUND ART

Conventionally, a semiconductor apparatus which includes plural kinds of semiconductor elements formed by different semiconductor materials has been known. For example, an IGBT (Insulated Gate Bipolar Transistor) module which includes IGBTs and diodes that become paired with the IGBTs is incorporated in a power convertor. In a case where temperature rating limits of IGBTs and diodes are different, elements which have higher temperature rating limits are made of SiC (silicon carbide), i.e. the elements are constituted of a SiC semiconductor, and elements which have lower temperature rating limit are made of Si (silicon), i.e. the elements are constituted of a Si semiconductor (see, e.g., Patent Document 1).

Although silicon carbide has higher heat tolerance than silicon, manufacturing semiconductors from silicon carbide is more difficult than manufacturing semiconductors from silicon. Thus silicon carbide is used for manufacturing diodes which have more simple structures than transistors.

Patent Document 1: Japanese Laid-Open Patent Application No. 2004-221381

DISCLOSURE OF INVENTION

Problem to be Solved by the Invention

Since the conventional semiconductor apparatus includes semiconductor elements which have different temperature rating limits and are mounted on a common substrate, there is a problem in that degradation of efficiency of thermal radiation may occur. In addition to this, there is a problem in that degradation of reliability caused by thermal interference which affects dynamic characteristics of the semiconductor elements may occur.

Thus, it is an object of the present invention to provide a semiconductor apparatus which improves the reliability and the efficiency of thermal radiation.

Means for Solving the Problems

In a first aspect of the present invention, a semiconductor apparatus includes a first stacked body configured to include a first radiator plate, a first insulating layer, a first conductive layer and a first semiconductor element in this order; a second stacked body configured to include a second radiator plate, a second insulating layer, a second conductive layer and a second semiconductor element in this order and configured to be made of semiconductor material different from that of the first semiconductor element; and a connecting part configured to electrically connect the first conductive layer and the second conductive layer, wherein the first stacked body and the second stacked body are thermally insulated.

Herein, the second semiconductor element has a higher temperature rating limit than that of the first semiconductor element, and wherein a solder configured to electrically connect the second semiconductor element and the second conductive layer has higher heat tolerance than a solder configured to electrically connect the first semiconductor element and the first conductive layer.

Herein, the second semiconductor element has a higher temperature rating limit than that of the first semiconductor element, and wherein a solder configured to connect the second insulating layer and the second radiator plate has higher heat tolerance than a solder configured to connect the first insulating layer and the first radiator plate.

Herein, the semiconductor apparatus further comprises a radiator configured to have mounted the first radiator plate and the second radiator plate thereon, wherein the second semiconductor element has a higher temperature rating limit than that of the first semiconductor element, and wherein the second semiconductor element is arranged in an upper stream side of a flow path of a cooling medium of the radiator relative to the first semiconductor element.

Herein, a planar dimension of a second area, located on the radiator, in which the second radiator plate is mounted is larger than a planar dimension of a first area, located on the radiator, in which the first radiator plate is mounted.

Herein, a mounting position of the first radiator plate with regard to the radiator and a mounting position of the second radiator plate with regard to the radiator are different in a height direction.

Herein, semiconductor material of the first semiconductor element and semiconductor material of the second semiconductor element have different temperature rating limits.

Herein, the semiconductor apparatus further comprises a heat insulating part configured to be disposed between the first stacked body and the second stacked body.

Herein, the first semiconductor element is constituted of a Si semiconductor element, and wherein the second semiconductor element is constituted of a SiC semiconductor element, a GaN semiconductor element or a diamond semiconductor element.

Herein, the first semiconductor element is constituted of IGBT included in an inverter or a convertor, and wherein the second semiconductor element is constituted of diode configured to form a pair with the IGBT.

Herein, the inverter or the convertor configured to include the pair of the IGBT and the diode is modularized as a power conversion apparatus.

Effects of the Invention

In accordance with the present invention, a semiconductor apparatus which improves the reliability and the efficiency of thermal radiation can be provided.

BEST MODE FOR CARRYING OUT THE INVENTION

In the following, preferred embodiments of the present invention are described with reference to the drawings.

Embodiment 1

Figure 1:
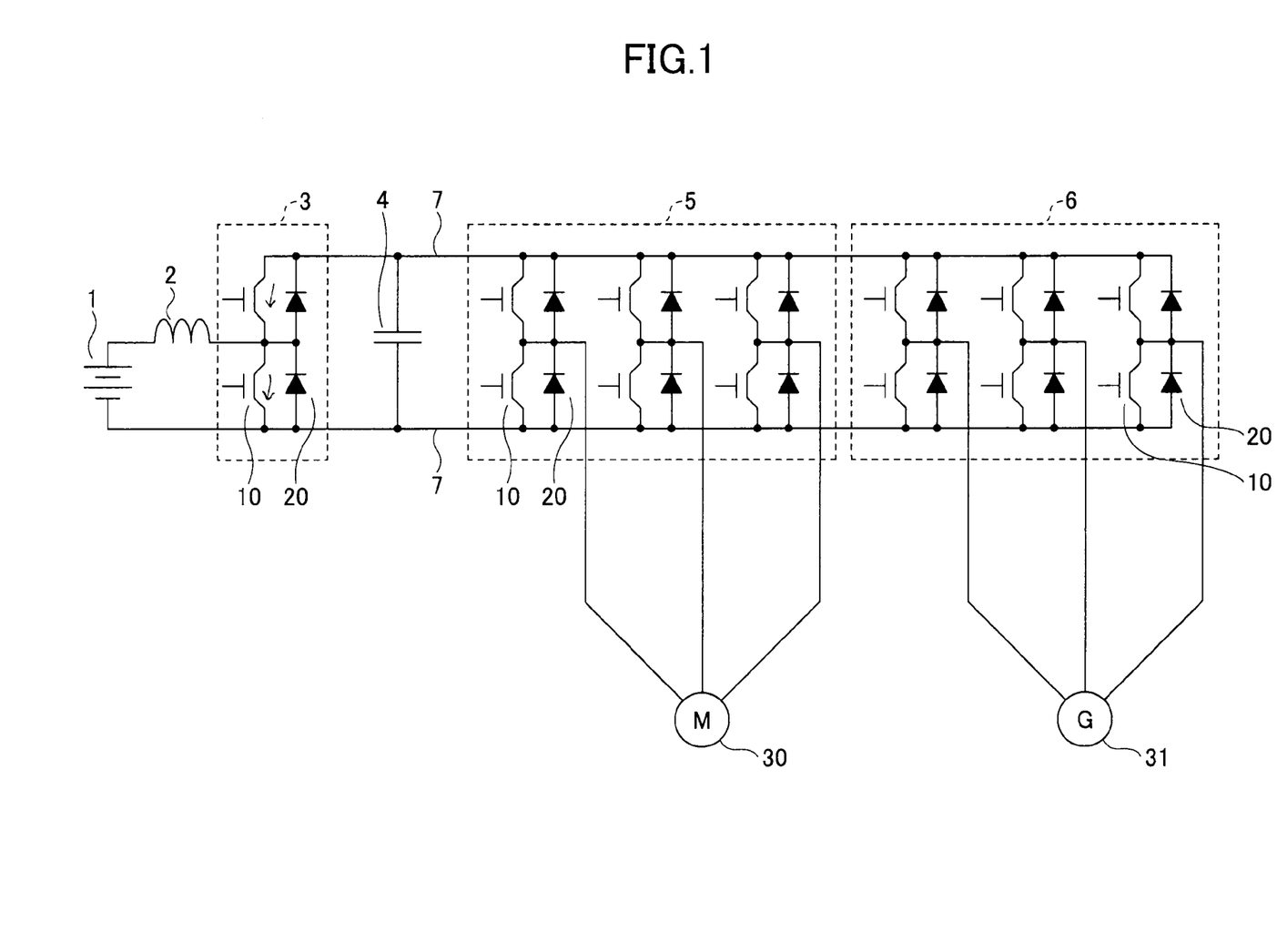
FIG. 1 shows a circuit configuration in which a semiconductor apparatus according to embodiment 1 of the present invention is incorporated.

FIG. 1 shows a circuit configuration in which a semiconductor apparatus according to embodiment 1 of the present invention is incorporated. The semiconductor apparatus according to embodiment 1 is, for example, incorporated in a power conversion circuit of a hybrid vehicle which includes a motor 30 for assisting drive power of the hybrid vehicle and a generator 31 for generating power which is driven by an internal-combustion engine.

The power conversion circuit includes a battery 1, a reactor 2, a dual (step up and step down) convertor 3, a smoothing capacitor 4, an inverter 5 which is used for controlling the motor 30 and a convertor 6 which converts AC (alternating current) power generated by the generator 31 into DC (direct current) power. In this power conversion circuit, the inverter 5 and the convertor 6 are connected to a DC transmission line 7.

The dual convertor 3 constitutes a half bridge circuit which includes a pair of an IGBT 10 and a diode 20 for stepping up power and another pair of an IGBT 10 and a diode 20 for stepping down power. The dual convertor 3 is controlled to step up voltage of the DC transmission line 7 (i.e. to discharge the battery 1) and to step down voltage of the DC transmission line 7 (i.e. to charge the battery 1) based on state of charge of the battery 1 and drive status of the motor 30 and the generator 31. Herein, the pair of the IGBT 10 and the diode 20 for stepping up power is arranged in a lower side of the dual convertor 3, and the pair of the IGBT 10 and the diode 20 for stepping down power is arranged in an upper side of the dual convertor 3.

Although the dual convertor 3 includes one pair of the IGBT 10 and the diode 20 for stepping up power and one pair of the IGBT 10 and the diode 20 for stepping down power as shown in FIG. 1, the dual convertor 3 may include plural pairs of the IGBTs 10 and the diodes 20 for stepping up power and plural pairs of the IGBTs 10 and the diodes 20 for stepping down power in accordance with rated power of the IGBT 10 and/or the diode 20, and/or in accordance with power which the dual convertor 3 handles.

The inverter 5 constitutes a three phase inverter circuit which includes six pairs of the IGBTs 10 and the diodes 20. The six pairs of the IGBTs 10 and the diodes 20 are used for driving the motor 30 which is used for assisting drive power of the hybrid vehicle. The inverter 5 is controlled to drive the motor 30 based on loading status of the engine and state of charge of the battery 1. Although the power conversion circuit includes one inverter 5 which includes six pairs of the IGBTs 10 and the diodes 20 as shown in FIG. 1, the power conversion circuit may include plural of the inverters 5 in accordance with rated power of the IGBT 10 and/or the diode 20, and/or in accordance with power which the power conversion circuit handles.

The convertor 6 constitutes a three phase convertor circuit which includes six pairs of the IGBTs 10 and the diodes 20. The six pairs of the IGBTs 10 and the diodes 20 are used for converting AC power generated by the generator 31 into DC power. The convertor 6 is controlled to drive the generator 31 based on loading status of the engine and state of charge of the battery 1. Although the power conversion circuit includes one convertor 6 which includes six pairs of the IGBTs 10 and the diodes 20 as shown in FIG. 1, the power conversion circuit may include plural of the convertors 6 in accordance with rated power of the IGBT 10 and/or the diode 20, and/or in accordance with power which the power conversion circuit handles.

As described above, the dual convertor 3, the inverter 5 and the convertor 6 include plural pairs of the IGBTs 10 and the diodes 20. Each of the dual convertor 3, the inverter 5 and the convertor 6 is modularized as a power conversion apparatus. Each of the power conversion apparatuses is contained in a housing which can shield against electromagnetic waves in order to prevent switching noise of the IGBTs 10 from leaking outside the power conversion apparatus. The housing or the like will next be described in detail with reference to FIGS. 2 and 3.

A cooling system of the hybrid vehicle includes two cooling systems. One cooling system is used for cooling the engine and the upper limit of coolant temperature is 95° C. The other cooling system is used for cooling the dual convertor 3, the inverter 5 or the convertor 6, and the upper limit of coolant temperature is 65° C.

Figure 2:
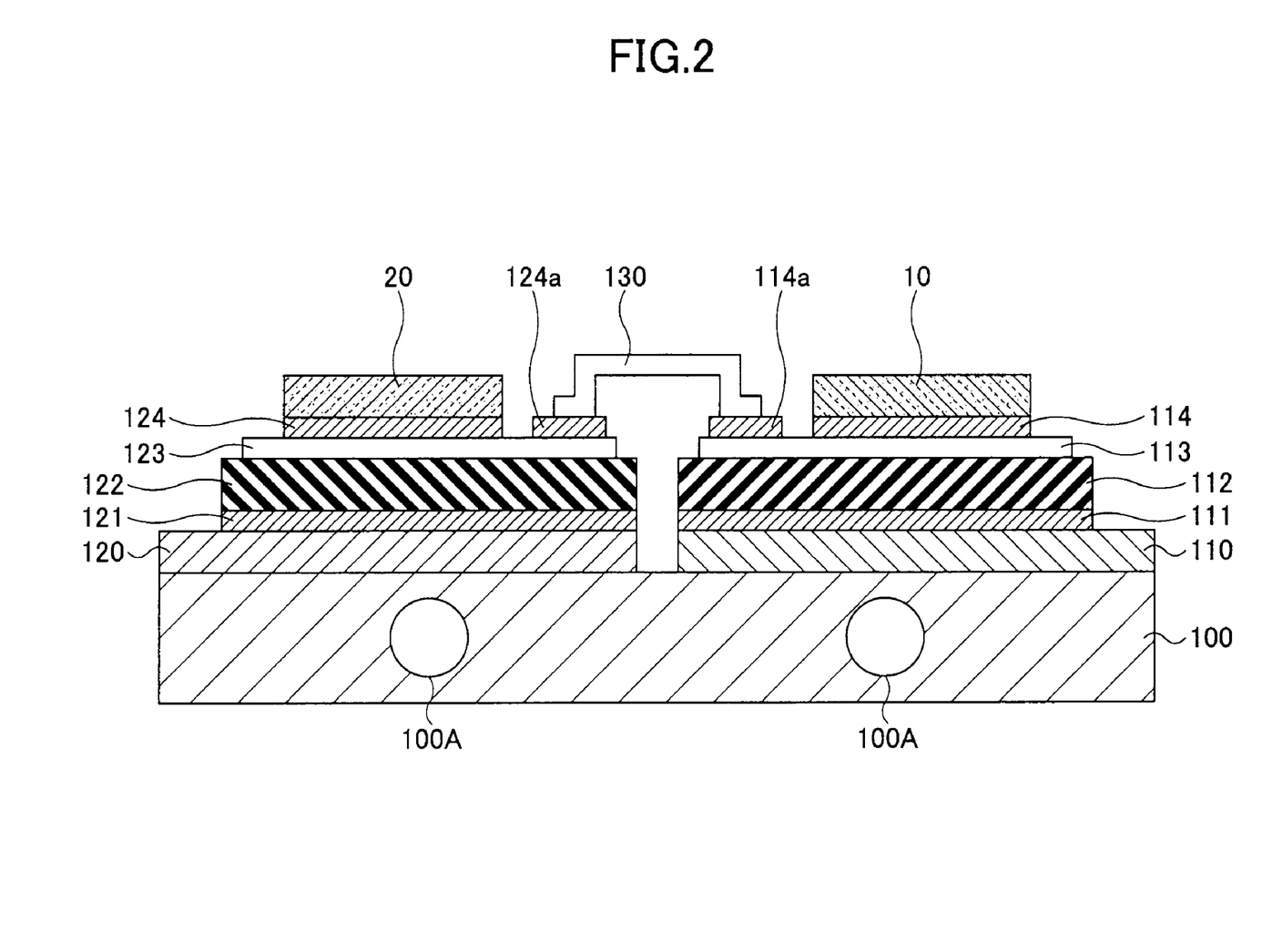
FIG. 2 shows a cross-sectional view of the semiconductor apparatus according to embodiment 1.

FIG. 2 shows a cross-sectional view of the semiconductor apparatus according to embodiment 1. Herein, the semiconductor apparatus includes the IGBT 10 made of Si semiconductor and the diode 20 made of SiC semiconductor. The rate of thermal expansion of the SiC semiconductor is smaller than that of the Si semiconductor, and the heat conductivity and the heat tolerance of the SiC semiconductor are higher than those of the Si semiconductor. Hereinafter, the diode 20 is used in an operation environment where the diode 20 radiates more heat than the IGBT 10.

Hereinafter, the operating temperature limit of the Si semiconductor is about 175° C., and the operating temperature limit of the SiC semiconductor is about 250° C.

This semiconductor apparatus includes a radiator 100, radiator plates 110 and 120, insulating plates 112 and 122, conductive plates 113 and 123, the IGBT 10 and the diode 20. The radiator plates 110 and 120 are disposed on the radiator 100 and are thermally insulated from each other. The insulating plates 112 and 122 are mounted on the radiator plates 110 and 120, respectively, by solders 111 and 121, respectively. The conductive plates 113 and 123 are mounted on the insulating plates 112 and 122, respectively. The IGBT 10 and the diode 20 are mounted on the conductive plates 113 and 123, respectively, by solders 114 and 124, respectively.

The conductive plates 113 and 123 are electrically connected by the solder 114a, a connecting plate 130 and the solder 124a. The IGBT 10 and the diode 20 are connected with each other to form the pair as shown in FIG. 1 by being connected by the connecting plate 130.

The radiator 100 includes a flow path 100A which is located internally in the radiator 100. Although two flow paths 100A are shown in FIG. 2, the two flow paths are connected to each other. The radiator 100 absorbs heat radiated from the IGBT 10 and the diode 20 via the radiator plates 110 and 120, and cools the IGBT 10 and the diode 20. The diode 20 which radiates more heat than the IGBT 10 is disposed on a lower stream side relative to the IGBT 10. The details of the flow path 100A will be described later.

Herein, the positional relationship among the IGBT 10, the diode 20 and the flow path 100A is illustrative only. The position of the flow path 100A in the direction of the width of the flow path 100A, i.e. in a lateral direction as shown in FIG. 2, with regard to the IGBT 10 and the diode 20 is not limited to the position as shown in FIG. 2. The position of the flow path 100A may be shifted as long as the diode 20 is disposed on the lower stream side relative to the IGBT 10.

Coolant which is flowing through the flow path 100A in the radiator 100 cools the dual convertor 3, the inverter 5 or the convertor 6 as shown in FIG. 1. Thus the upper limit of coolant temperature is 65° C.

The radiator plates 110 and 120 may be made of Aluminum Silicon Carbide (AlSiC) or molybdenum-copper (Cu—Mo), for example. It becomes easy to control the heat conductivity and the rate of thermal expansion by using AlSiC and Cu—Mo as the radiator plates 110 and 120. Widths of the radiator plate 110 and the radiator plate 120 are set to the same value. Herein, the widths are the length in a lateral direction as shown in FIG. 2. Widths of the radiator plate 110 and the radiator plate 120 may be set to about 3 mm, for example.

The insulating plate 112 is disposed between the radiator plate 110 and the conductive plate 113 in order to insulate the radiator plate 110 and the conductive plate 113 from each other. The insulating plate 122 is disposed between the radiator plate 120 and the conductive plate 123 in order to insulate the radiator plate 120 and the conductive plate 123 from each other. The insulating plates 112 and 122 are connected onto the radiator plates 110 and 120 by solders 111 and 121, respectively. The insulating plates 112 and 122 are made of a ceramic such as aluminum nitride (AlN), for example. Thicknesses of the insulating plates 112 and 122 are set to about 0.6 mm, for example.

The conductive plate 113 is disposed under the IGBT 10 in order to connect the IGBT 10 to an external wiring. The conductive plate 123 is disposed under the diode 20 in order to connect the diode 20 to an external wiring. The conductive plates 113 and 123 are made of copper (Cu) or aluminum (Al), for example. Thicknesses of the conductive plates 113 and 123 are set to about 0.4 mm, for example.

The IGBT 10 is connected onto the conductive plates 113 by the solder 114. The diode 20 is connected onto the conductive plates 123 by the solder 124. The diode 20 is inserted between the drain and the source of the IGBT 10 by electrically connecting the conductive plate 113 and the conductive plate 123 via the solder 114a, the connecting plate 130 and the solder 124a.

As described above, the semiconductor apparatus according to embodiment 1 includes a first layered stacked body which includes the radiator plate 110, the insulating plate 112, the conductive plate 113 and the IGBT 10, and a second stacked body which includes the radiator plate 120, the insulating plate 122, the conductive plate 123 and the diode 20. The first stacked body and the second stacked body are thermally insulated from each other, and are mounted onto the radiator 100 in proximity to each other. The second stacked body including the diode 20 which radiates more heat than the IGBT 10 is located at a lower stream side relative to the first stacked body including the IGBT 10 in the flowing direction of the coolant in the flow path 100A.

Thus it becomes possible to cool the IGBT 10 effectively and to prevent the diode 20 from overcooling by reducing the heat conduction from the diode 20 to the IGBT 10.

According to the present embodiment, the IGBT 10 is constituted of the Si semiconductor element which has comparatively-low robustness at high temperature and has relatively low heat tolerance. Although the temperature of the coolant is 65° C. at the maximum, it becomes possible to cool the IGBT 10 effectively, and to reduce temperature increase of the IGBT 10 by cooling the IGBT 10 before cooling the diode 20.

It becomes possible to cool the diode 20 effectively and to prevent the diode 20 from overcooling by cooling the diode 20 after cooling the IGBT 10 which is constituted of an Si semiconductor element having relatively low heat tolerance.

As described above, according to embodiment 1, it becomes possible to cool the IGBT 10 and the diode 20 of the semiconductor apparatus.

Figure 3:
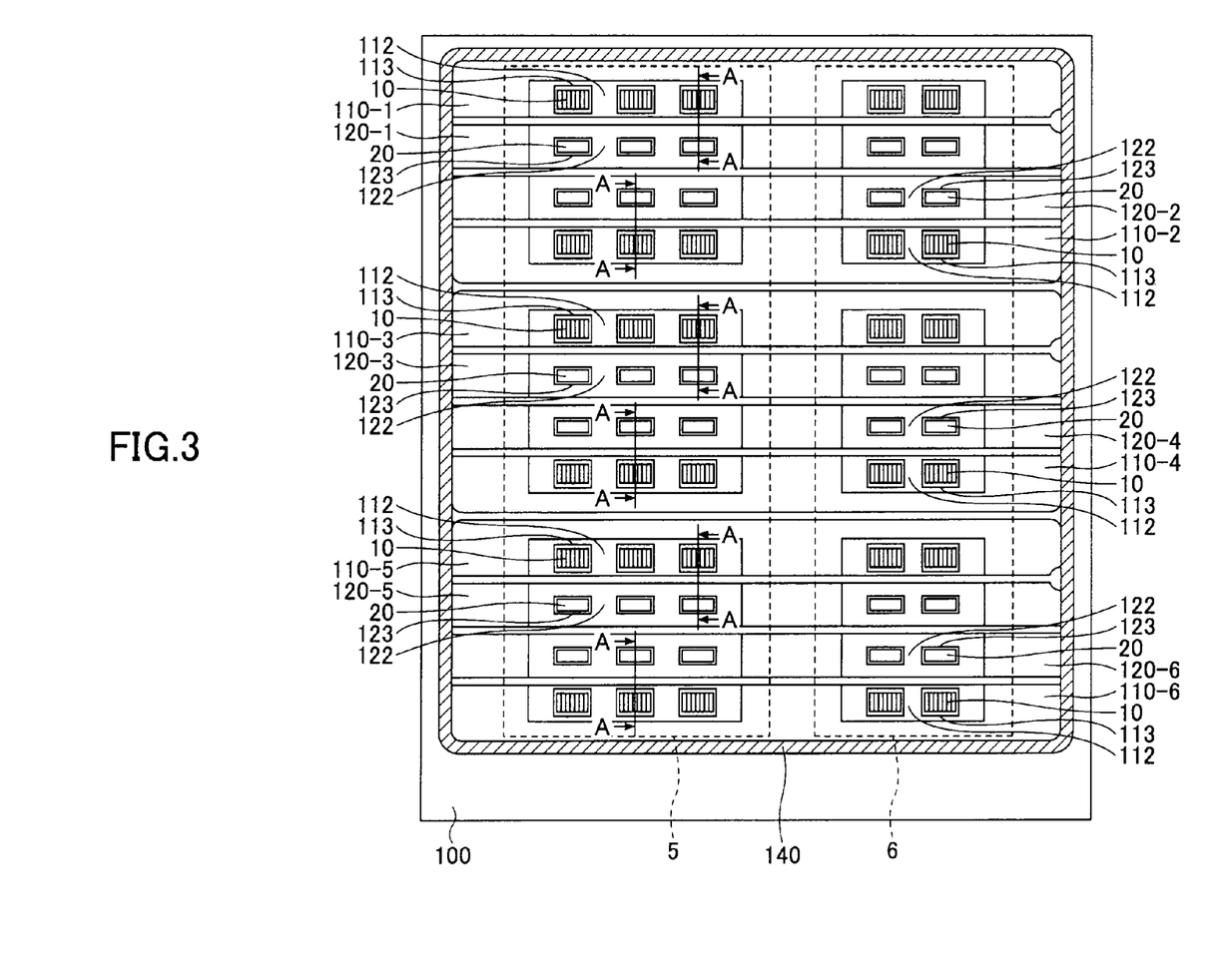
FIG. 3 shows a planar view of a circuit configuration of a power conversion apparatus which is formed by modularizing the semiconductor apparatus according to embodiment 1.

FIG. 3 shows a planar view of a circuit configuration of the power conversion apparatus which is formed by modularizing the semiconductor apparatus according to embodiment 1. The power conversion apparatus includes the inverter 5 and the convertor 6, as shown in FIG. 1, which are connected in parallel with each other.

As already described with reference to the cross-sectional structure shown in FIG. 2, the semiconductor apparatus according to embodiment 1 includes the first stacked body and the second stacked body which are mounted onto the radiator 100 and are thermally insulated from each other. The first stacked body includes the radiator plate 110, the insulating plate 112, the conductive plate 113 and the IGBT 10. The second stacked body includes the radiator plate 120, the insulating plate 122, the conductive plate 123 and the diode 20.

The inverter 5 includes six radiator plates 110 and six radiator plates 120 which are arranged alternately in the direction from the top to the bottom as shown in FIG. 3. Similarly, the convertor 6 includes six radiator plates 110 and six radiator plates 120 which are arranged alternately in the direction from the top to the bottom as shown in FIG. 3.

The insulating plates 112, the conductive plates 113 and the IGBTs 10 are stacked on every radiator plate 110. The insulating plates 122, the conductive plates 123 and the diodes 20 are stacked on every radiator plate 120.

Herein, as a matter of convenience, the connecting plate 130 is omitted in FIG. 3. The cross section as shown in FIG. 2 corresponds to A-A cross section of FIG. 3. Each pair of the thirty pairs (six rows by five columns) of the IGBTs 10 and the diodes 20 as shown in FIG. 3 has the same cross-sectional structure as shown in FIG. 2.

Herein, reference numerals 110-1 to 110-6 and 120-1 to 120-6 are assigned to the six radiator plates 110 and the six radiator plates 120 on which the thirty pairs (six rows by five columns) of the IGBTs 10 and the diodes 20 are mounted. The suffixes attached to the reference numerals 110 and 120 correspond to row numbers (1 to 6) of the IGBTs 10 and the diodes 20.

Among the thirty pairs (six rows by five columns) of the IGBTs 10 and the diodes 20, three IGBTs 10 and three diodes 20 included in every column constitute the three phase inverter circuit or the three phase convertor circuit as shown in FIG. 1. Among five columns, three columns on the left side constitute the three phase inverter circuits which are connected in parallel with each other, and two columns on the right side constitute the three phase convertor circuit. This configuration shows three inverters 5, each of which has the circuit configuration as shown in FIG. 1, connected in parallel with each other, and two convertors 6, each of which has the circuit configuration as shown in FIG. 1, connected in parallel with each other.

Thirty pairs (six rows by five columns) of the IGBTs 10 and the diodes 20 are surrounded by a side wall 140 of the housing. The housing includes a cap part which covers a top portion as shown in FIG. 3. The side wall 140 and the radiator 100 are sealed in the bottom side.

Figure 4:
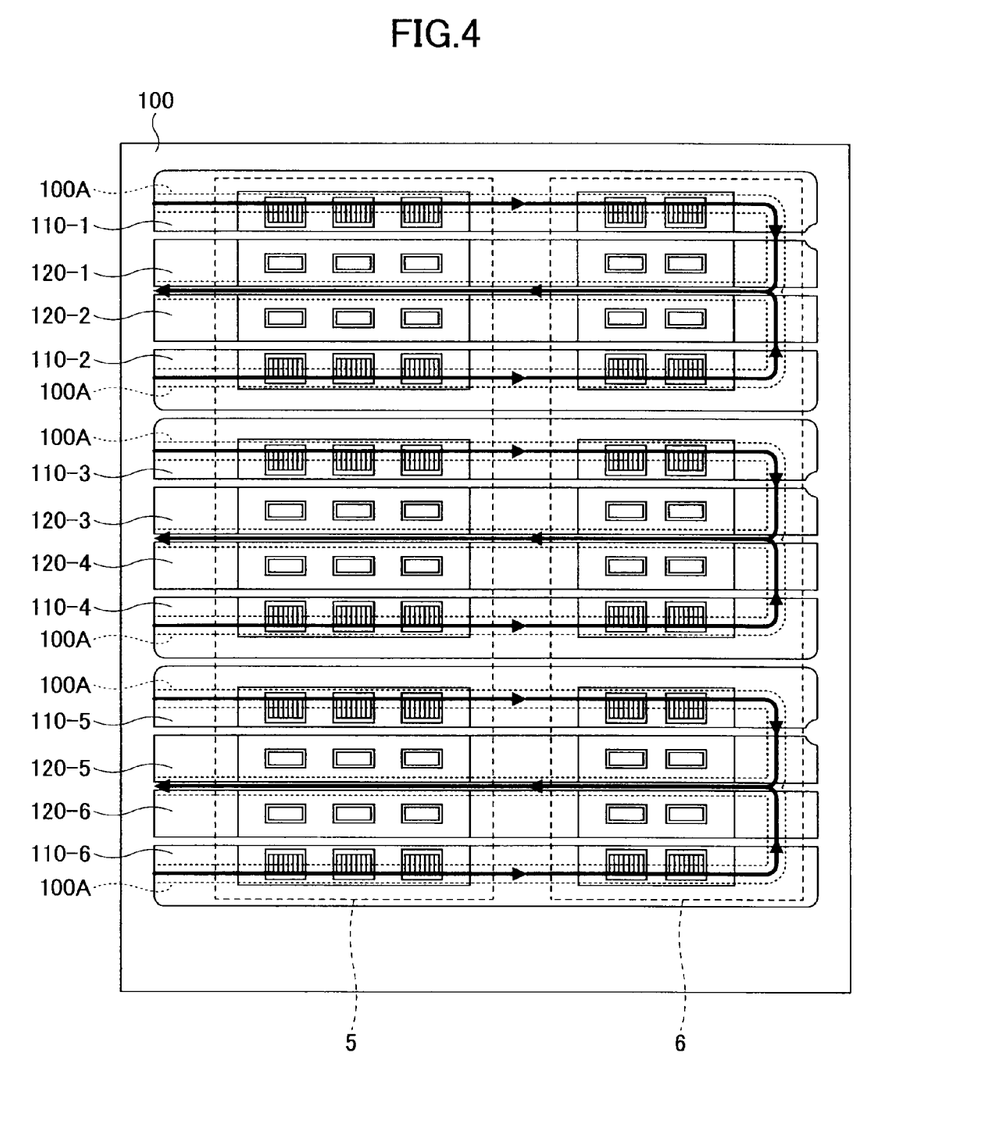
FIG. 4 shows exemplary paths of flow paths 100A arranged in the whole area of a radiator 100 according to embodiment 1.

FIG. 4 shows exemplary paths of the flow paths 100A arranged in the whole area of the radiator 100 according to embodiment 1. Although the positional relationship among the IGBTs 10, the diodes 20 and the flow paths 100A are different from the positional relationship as shown in FIG. 2, the diodes 20 are disposed on a lower stream side relative to the IGBTs 10.

As shown in FIG. 4, the flow paths 100A of the radiator 100 are arranged in three groups, i.e. the first row and the second row, the third row and the fourth row and the fifth row and the sixth row.

In the first and second rows, as shown in FIG. 4, the flow paths 100A run from left side to right side under the radiator plates 110-1 and 110-2, respectively. Then the flow paths 100A return and join together, and run from right side to left side under the radiator plates 120-1 and 120-2.

In the third and fourth rows, as shown in FIG. 4, the flow paths 100A run from left side to right side under the radiator plates 110-3 and 110-4, respectively. Then the flow paths 100A return and join together, and run from right side to left side under the radiator plates 120-3 and 120-4.

In the fifth and sixth rows, as shown in FIG. 4, the flow paths 100A run from left side to right side under the radiator plates 110-5 and 110-6, respectively. Then the flow paths 100A return and join together, and run from right side to left side under the radiator plates 120-5 and 120-6.

According to embodiment 1, as described above, the power conversion apparatus, formed by modularizing the semiconductor apparatus according to embodiment 1, includes the thirty pairs (six rows by five columns) of the IGBTs 10 and the diodes 20. The IGBTs 10 and the diodes 20 are arranged along the flow paths 100A so that the IGBTs 10 which radiate less heat per unit area than the diodes 20 are disposed on an upper stream side relative to the diodes 20, and the diodes 20 which radiate more heat per unit area than the IGBTs 10 are disposed on a lower stream side relative to the IGBTs 10.

Thus it becomes possible to cool the IGBTs 10, having relatively low heat tolerance, effectively by reducing the heat conduction from the diodes 20 to the IGBTs 10. It becomes possible to cool the diodes 20, having relatively high heat tolerance, effectively and to prevent the diode 20 which is constituted of SiC semiconductor from overcooling. As described above, the power conversion apparatus, formed by modularizing the semiconductor apparatus according to embodiment 1, can cool the IGBTs 10 and the diodes 20 effectively.

Further, it becomes possible to reduce the amount of the coolant by sharing the flow paths 100A, and to achieve simplification of the cooling systems by reducing the amount of the coolant flowing through the flow paths 100A.

Although the semiconductor apparatus according to embodiment 1, including the radiator plate 110 and the radiator plate 120 which are separated from each other and on which the IGBT 10 and the diode 20 are mounted, is applied to both the inverter 5 and the convertor 6, the semiconductor apparatus as described above may be applied to any one or two of the dual convertor 3, the inverter 5 and the convertor 6. Further, the semiconductor apparatus as described above may be applied to all of the dual convertor 3, the inverter 5 and the convertor 6.

In this case, a semiconductor apparatus which does not have the circuit configuration of the semiconductor apparatus according to embodiment 1 may include a common radiator plate on which the IGBT 10 and the diode 20 are mounted.

Since the amounts of heat radiation of the IGBT 10 and the diode 20 are different, the solder 111 which connects the radiator plate 110 and the insulating plate 112 and the solder 121 which connects the radiator plate 120 and the insulating plate 122 may be formed of different solder materials. Since the temperature of the diode 20 rises higher than that of the IGBT 10, the solder 121 may be formed of solder material which has a smaller rate of thermal expansion than that of the solder 111.

It becomes possible to prevent peel off and deformation of the solders 111 and 121 by selecting the solder materials of the solders 111 and 121 based on temperatures of areas in which the solders 111 and 121 are disposed and rates of thermal expansion of materials which are connected by the solders 111 and 121. Thus it becomes possible to provide the semiconductor apparatus with higher reliability by selecting the solder materials of the solders 111 and 121.

Similarly, the solder 114 which connects the conductive plate 113 and the IGBT 10 and the solder 124 which connects the conductive plate 123 and the diode 20 may be formed of different solder materials. The solder 124 may be formed of a solder material which has a smaller rate of thermal expansion than that of the solder 114. It becomes possible to prevent peel off and deformation of the solders 114 and 124 by selecting the solder materials of the solders 114 and 124. Thus it becomes possible to provide the semiconductor apparatus with higher reliability by selecting the solder materials of the solders 114 and 124.

Although, SiC is used as the semiconductor material of the diode 20 which radiates more heat than the IGBT 10, gallium nitride (GaN) or diamond (C) may be used as the semiconductor material of the diodes 20 instead of SiC. Gallium nitride (GaN) and diamond (C) have small rates of thermal expansion, high heat conductivity and high heat tolerance as well as SiC. Thus gallium nitride (GaN) and diamond (C) are suitable for the semiconductor material of the diode 20 which radiates much heat.

Embodiment 2

Figure 5:
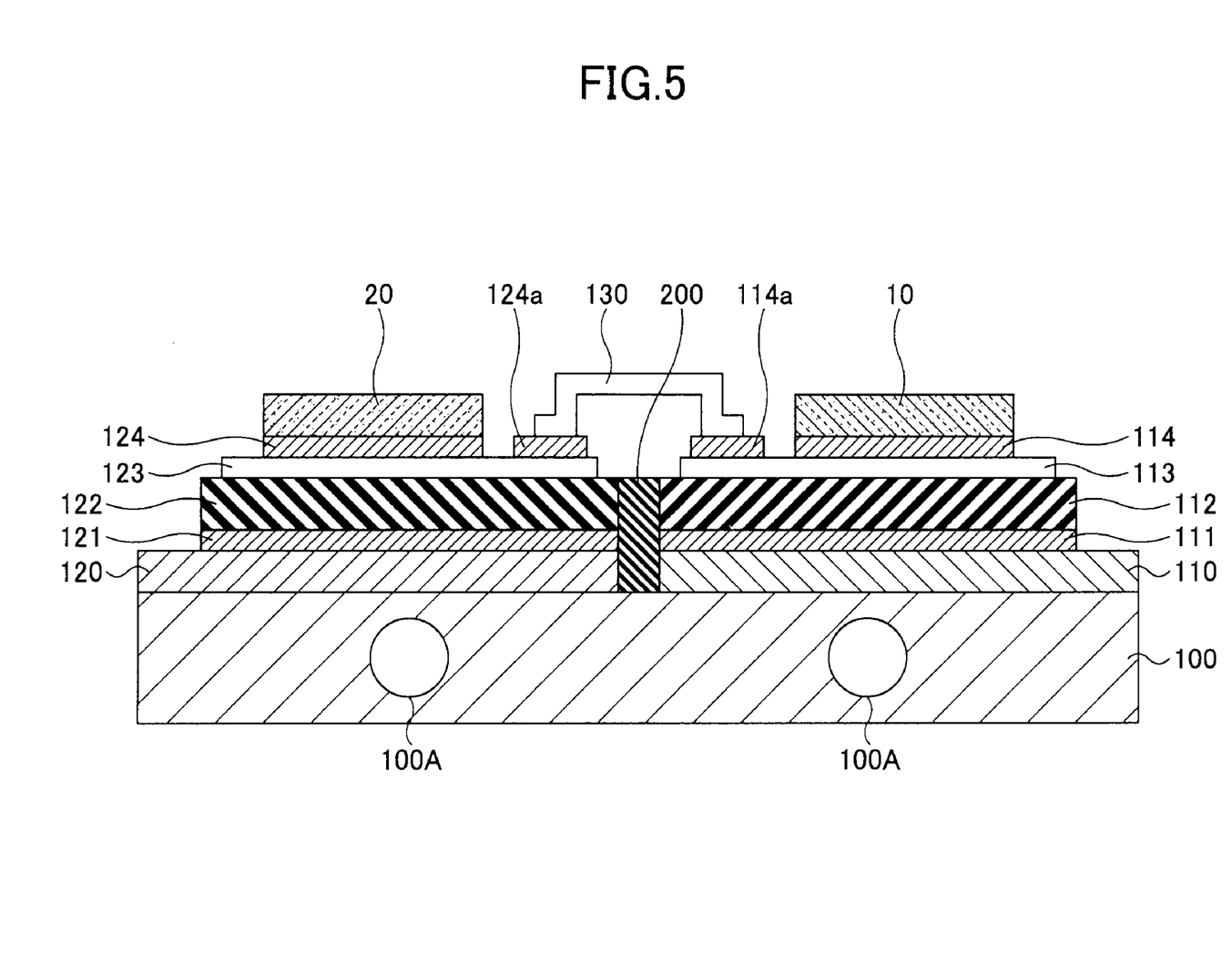
FIG. 5 shows a cross-sectional view of a semiconductor apparatus according to embodiment 2.

FIG. 5 shows a cross-sectional view of a semiconductor apparatus according to embodiment 2. The semiconductor apparatus according to embodiment 2 is different from the semiconductor apparatus according to embodiment 1 in that a heat insulating part 200 is disposed between the first stacked body and the second stacked body. The same elements as or similar elements to those of semiconductor apparatus according to embodiment 1 are referred to by the same reference numerals, and a description thereof is omitted.

The heat insulating part 200 thermally insulates the radiator plate 110, the solder 111, and the insulating plate 112 from the radiator plate 120, the solder 121, and the insulating plate 122. The heat insulating part 200 may be made of plastic such as polycarbonate or the like, for example.

The first stacked body including the radiator plate 110, the insulating plate 112, the conductive plate 113 and the IGBT 10, and the second stacked body including the radiator plate 120, the insulating plate 122, the conductive plate 123 and the diode 20 are thermally insulated from each other by disposing the heat insulating part 200 therebetween. Thus heat conduction such as radiation heat conduction between the first stacked body and the second stacked body is decreased and insulation properties between the first stacked body and the second stacked body are improved.

According to embodiment 2, it becomes possible to cool the IGBT 10 effectively by preventing heat conduction from the diode 20 to the IGBT 10.

The heat insulating part 200 may be formed additionally between the conductive plates 113 and 123.

The heat insulating part 200 may be formed integrally with the side wall 140 of the housing shown in FIG. 3.

Embodiment 3

Figure 6:
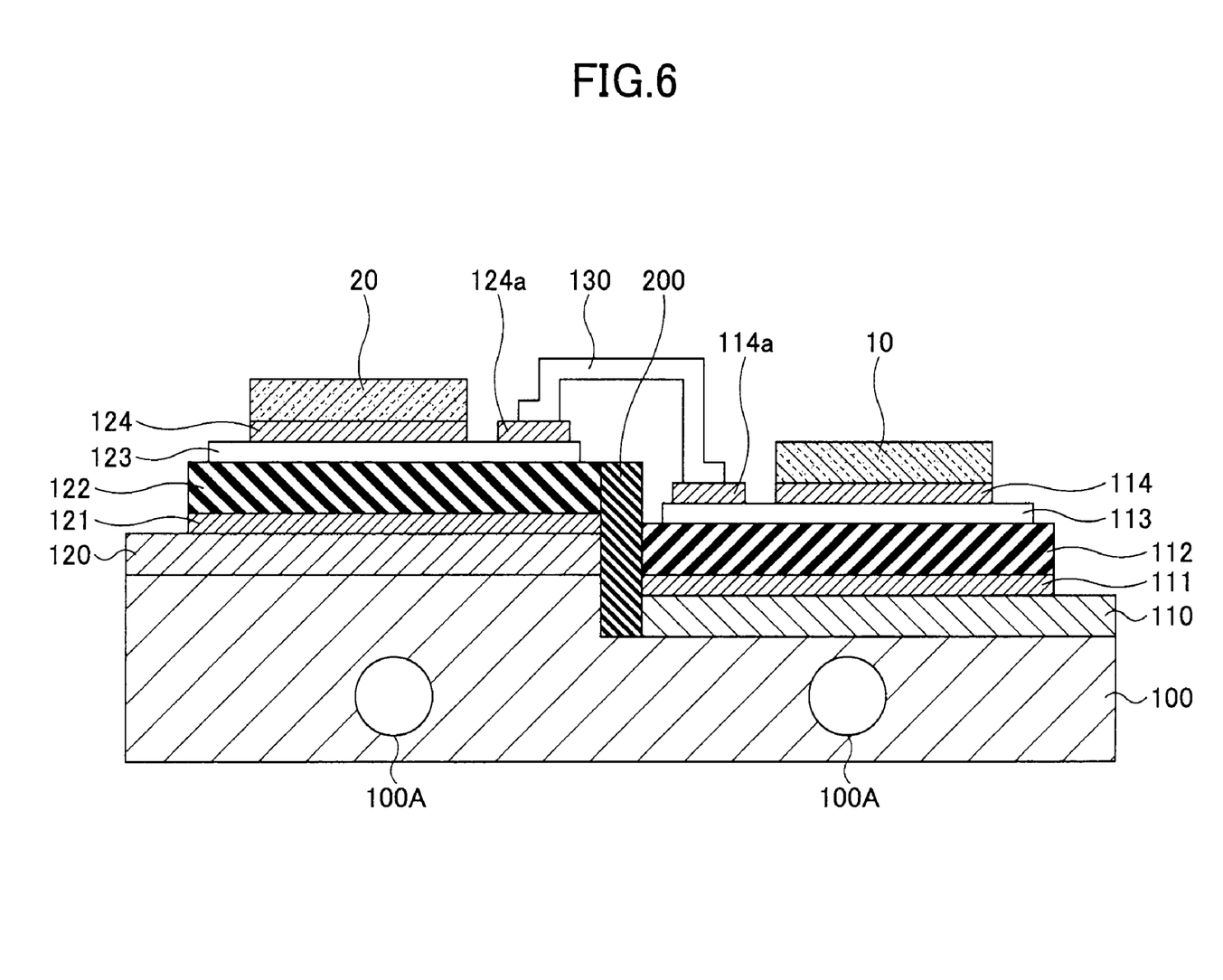
FIG. 6 shows a cross-sectional view of a semiconductor apparatus according to embodiment 3.

FIG. 6 shows a cross-sectional view of a semiconductor apparatus according to embodiment 3. The semiconductor apparatus according to embodiment 3 is different from the semiconductor apparatus according to embodiment 2 in that position of the first stacked body and position of the second stacked body are different in a height direction. The same elements as or similar elements to those of the semiconductor apparatus according to embodiment 2 are referred to by the same reference numerals, and a description thereof is omitted.

As shown in FIG. 6, the radiator 100 according to embodiment 3 includes a bump so that the position of the radiator plate 110 and position of the second stacked body 120 become different in the height direction. Thus positions of the solder 111, the insulating plate 112, conductive plate 113, the solder 114 and the IGBT 10 which are mounted on the radiator plate 110 and positions of the solder 121, the insulating plate 122, conductive plate 123, the solder 124 and the diode 20 which are mounted on the radiator plate 120 are different in height directions respectively. Herein, the length of the insulating part 200 in the height direction is increased by the bump.

Since the distance between the radiator plate 110 and the radiator plate 120 is increased by displacing the radiator plate 110 and the radiator plate 120 in the height direction as described above, it becomes possible to prevent heat conduction between the radiator plate 110 and the radiator plate 120. Thus it becomes possible to provide the semiconductor apparatus which can cool the IGBT 10 effectively and can prevent the diode 20 from overcooling.

Embodiment 4

Figure 7:
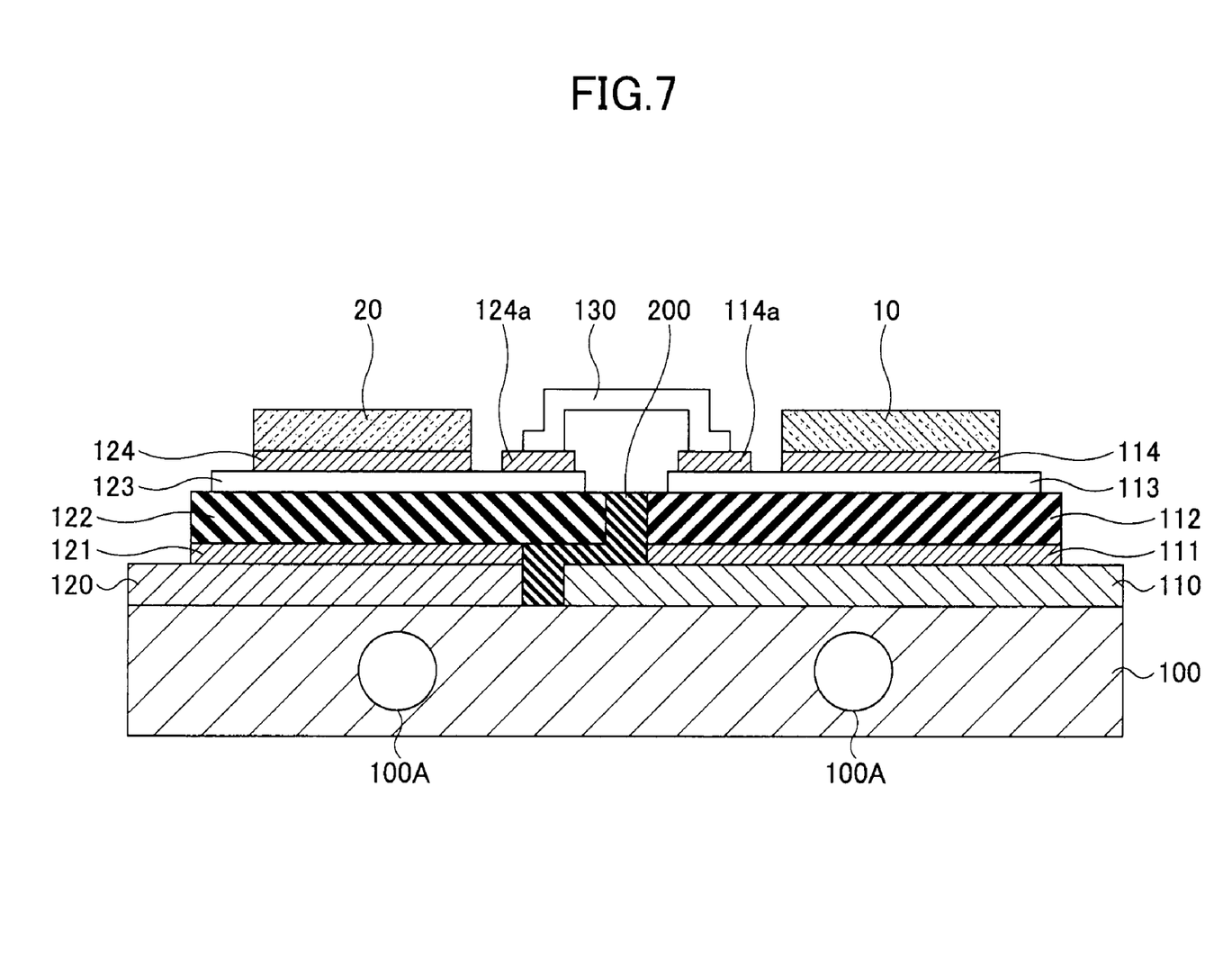
FIG. 7 shows a cross-sectional view of a semiconductor apparatus according to embodiment 4.

FIG. 7 shows a cross-sectional view of a semiconductor apparatus according to embodiment 4. The semiconductor apparatus according to embodiment 4 is different from the semiconductor apparatus according to embodiment 2 in that a planar dimension of the radiator plate 110 included in the first stacked body and a planar dimension of the radiator plate 120 included in the second stacked body are different in a planar view. The same elements as or similar elements to those of semiconductor apparatus according to embodiment 2 are referred to by the same reference numerals, and a description thereof is omitted.

According to embodiment 4, the radiator plate 110 is formed wider than the radiator plate 120 in a lateral direction, as shown in FIG. 7, so that radiation performance of the IGBT 10 can be improved.

Herein, widths of the insulating plates 112 and 122, and widths of the conductive plates 113 and 123 are the same as those of the semiconductor apparatus according to embodiment 2. Thus the heat insulating part 200 is crank-shaped.

As described above, it becomes possible to improve the radiation performance of the radiation plate 110 which cools the IGBT 10, having relatively low heat tolerance, by forming the radiator plate 110 wider than the radiator plate 120 in a lateral direction. Thus it becomes possible to provide the semiconductor apparatus which can cool the IGBT 10 more effectively and can maintain radiation performance of the diode 20.

Embodiment 5

Figure 8:
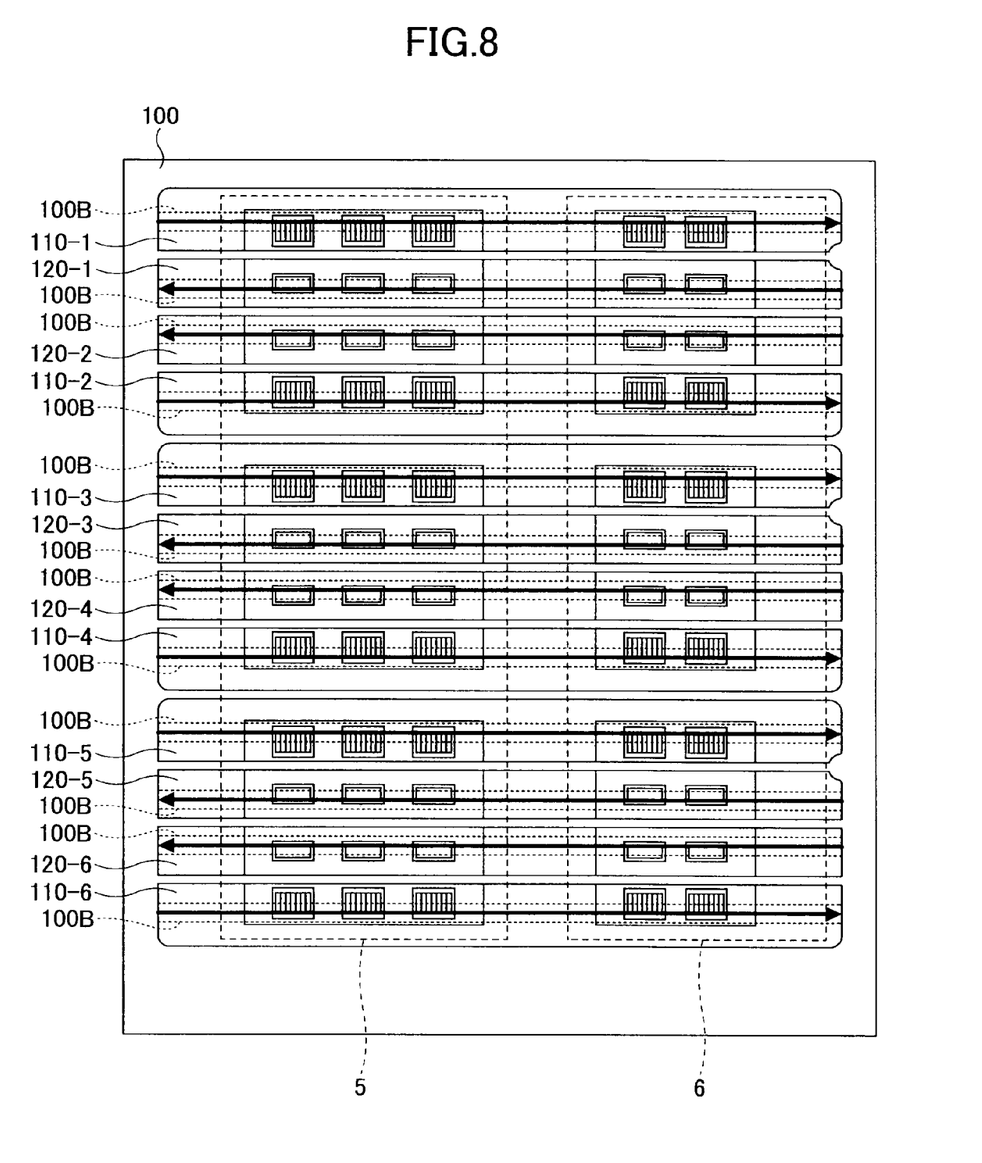
FIG. 8 shows a planar view of a circuit configuration of a power conversion apparatus which is formed by modularizing a semiconductor apparatus according to embodiment 5.

FIG. 8 shows a planar view of a circuit configuration of the power conversion apparatus which is formed by modularizing the semiconductor apparatus according to embodiment 5. The semiconductor apparatus according to embodiment 5 is different from the semiconductor apparatus according to embodiment 1 in that flowing patterns of flow paths 100B are different from flowing patterns of the flow paths 100A of the semiconductor apparatus (shown in FIG. 4). The same elements as or similar elements to those of the semiconductor apparatus according to embodiment 1 are referred to by the same reference numerals, and a description thereof is omitted.

As shown in FIG. 8, according to the radiator 100 of embodiment 5, the flow paths 100B which are disposed under the radiator plates 110 (110-1 to 110-6) included in rows (from the first row to the sixth row) and the flow paths 100B which are disposed under the radiator plates 120 (120-1 to 120-6) included in rows (from the first row to the sixth row) are divided. Further, the flow paths 100B disposed under the radiator plates 110 (110-1 to 110-6) are arranged in parallel with each other, and the flow paths 100B disposed under the radiator plates 120 (120-1 to 120-6) are arranged in parallel with each other.

The radiator plates 110 (110-1 to 110-6) are used for cooling the IGBTs 10 which have relatively low heat tolerance. The flow paths 100B disposed under the radiator plates 110 (110-1 to 110-6) are connected to the cooling system of which the upper limit of coolant temperature is 65° C. The radiator plates 120 (120-1 to 120-6) are used for cooling the diodes 20 which have relatively high heat tolerance. The flow paths 100B disposed under the radiator plates 120 (120-1 to 120-6) are connected to the cooling system of which the upper limit of coolant temperature is 95° C.

As described above, cooling paths of the radiator are divided into cooling paths which cool the IGBTs 10 and cooling paths which cool the diodes 20. Further, the cooling paths which cool the IGBTs 10 are connected to the cooling system in which the coolant with lower temperature is flowing through. Thus it becomes possible to provide the semiconductor apparatus which can cool the IGBTs 10 effectively and can prevent the diodes 20 from overcooling.

Herein, in a case where it is possible to maintain cooling performance in such a semiconductor apparatus having the divided cooling paths as described above, air may be used as a cooling medium for cooling any of the IGBTs 10 or the diodes 20 instead of the coolant.

Embodiment 6

Figure 9:
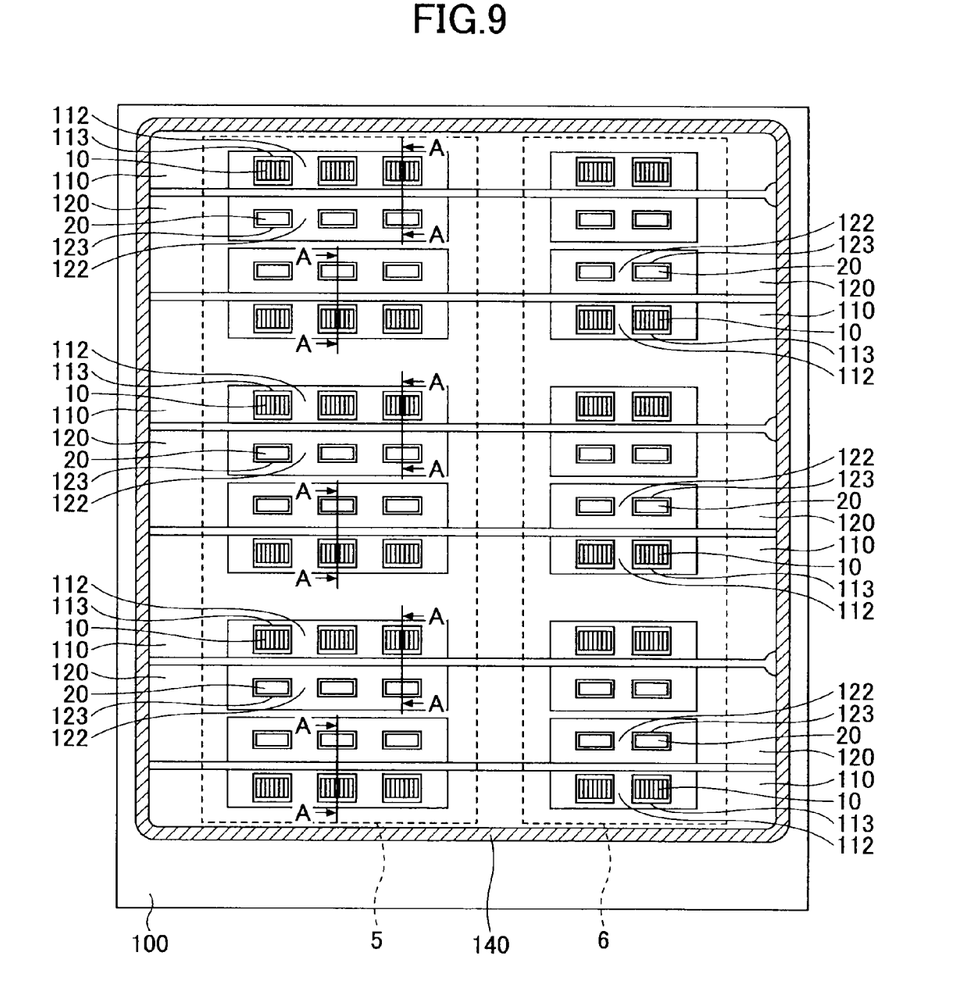
FIG. 9 shows a planar view of a circuit configuration of a power conversion apparatus which is formed by modularizing a semiconductor apparatus according to embodiment 6.

FIG. 9 shows a planar view of a circuit configuration of the power conversion apparatus which is formed by modularizing the semiconductor apparatus according to embodiment 6. The semiconductor apparatus according to embodiment 6 is different from the semiconductor apparatus according to embodiment 1 in that the radiator plates 110 which are adjacent to each other are integrated with each other, and the radiator plates 120 which are adjacent to each other are integrated with each other. Further, flowing patterns of flow path 100C are different from flowing patterns of the flow paths 100A of the semiconductor apparatus (shown in FIG. 4). The same elements as or similar elements to those of semiconductor apparatus according to embodiment 1 are referred to by the same reference numerals, and a description thereof is omitted.

The radiator plates 110 according to embodiment 6 are obtained by integrating the radiator plates 110-2 and 110-3, and radiator plates 110-4 and 110-5, as shown in FIG. 3, respectively.

The radiator plates 120 are obtained by integrating the radiator plates 120-1 and 120-2, radiator plates 120-3 and 120-4, and radiator plates 120-5 and 120-6, as shown in FIG. 3, respectively.

Figure 10:
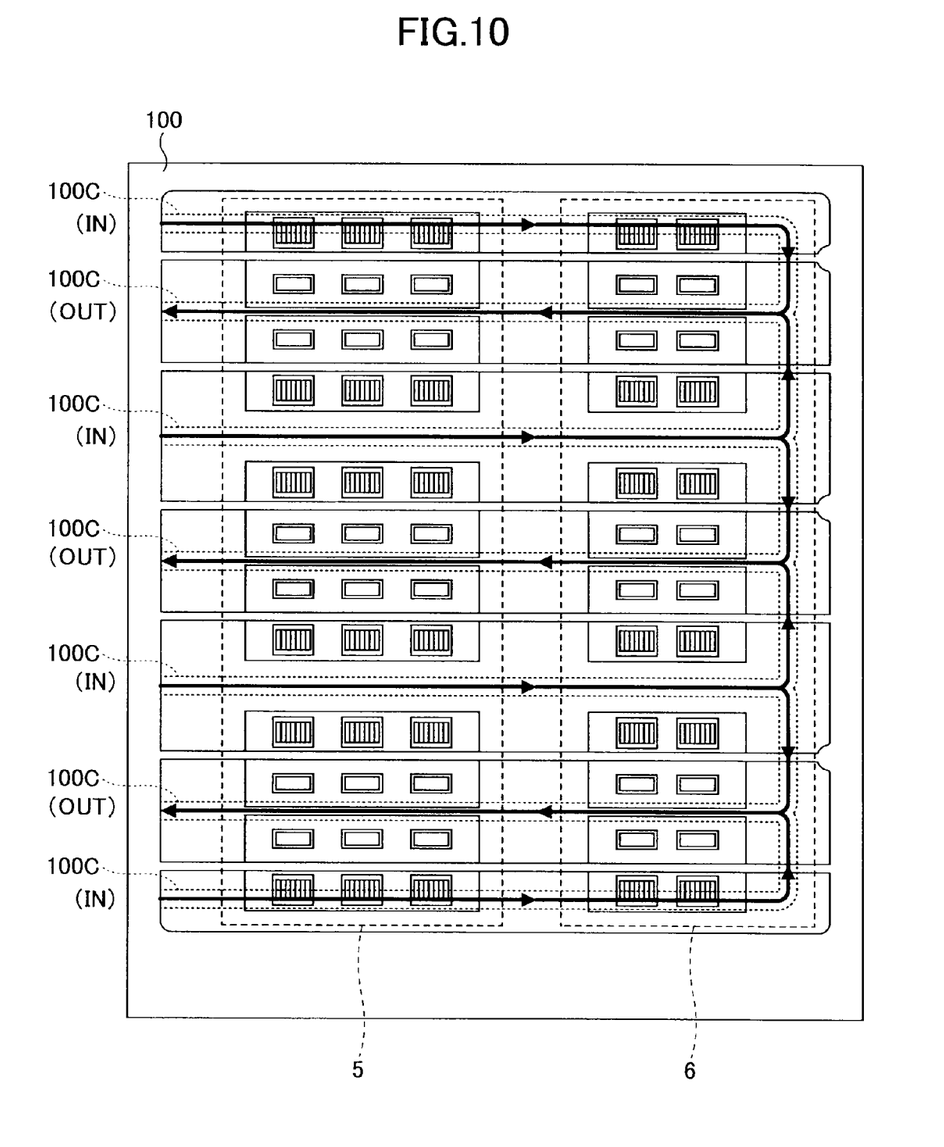
FIG. 10 shows exemplary paths of flow paths arranged in a radiator 100 according to embodiment 6.

FIG. 10 shows exemplary paths of flow paths arranged in the radiator 100 according to embodiment 6.

The flow path 100C is integrated, and has four inflow ports (IN) which are disposed on the left side and three outflow ports (OUT) which are disposed on the left side.

According to the configuration of the flow path 100C as described above, it becomes possible to arrange the IGBTs 10 in upper stream relative to the diodes 20 and to arrange the diodes 20 in lower stream relative to the IGBTs 10.

As described above, according to the power conversion apparatus which is formed by modularizing the thirty pairs (six rows by five columns) of the IGBTs 10 and the diodes 20, the radiator plates 110 on which the IGBTs 10 are arranged in adjacent rows are integrated, and the radiator plates 120 on which the diodes 20 are arranged in adjacent rows are integrated. It becomes possible to provide the semiconductor apparatus which can cool the IGBTs 10 effectively and can prevent the diodes 20 from overcooling by arranging the IGBTs 10, which are constituted of Si semiconductor, in the upper stream side and arranging the diodes 20, which are constituted of SiC semiconductor, in the lower stream side.

Herein, dimensions as described above are illustrative only, and the present invention is not intended to eliminate dimensions other than those described above.

The present invention is not limited to these embodiments, but variations and modifications may be made without departing from the scope of the present invention.

DESCRIPTION OF REFERENCE NUMERALS

1 battery
2 reactor
3 dual convertor
4 smoothing capacitor
5 inverter
6 convertor
7 DC transmission line
10 IGBT
20 diode
30 motor
31 generator
100 radiator
100A, 100B, 100C flow path
110, 110-1, 110-2, 110-3, 110-4, 110-5, 110-6, 120, 120-1, 120-2, 120-3, 120-4, 120-5, 120-6 radiator plate
111, 121, 114, 124, 114a, 124a solder
112, 122 insulating plate
113, 123 conductive plate
130 connecting plate
140 side wall
200 heat insulating part The present application is based on Japanese Priority Application No. 2008-122296 filed on May 8, 2008 with the Japanese Patent Office, the entire contents of which are hereby incorporated by reference.

The invention claimed is:

1. A semiconductor apparatus comprising:
a first stacked body including a first radiator plate, a first insulating layer, a first conductive layer, and a first semiconductor element, stacked upon each other in this order;
a second stacked body including a second radiator plate, a second insulating layer, a second conductive layer, and a second semiconductor element, stacked upon each other in this order, the second semiconductor element being made of a semiconductor material different from a semiconductor material of the first semiconductor element;
a radiator on which the first and second stacked bodies are mounted via the first and second radiator plates, respectively, the radiator including a flow path disposed internally; and
a connecting part that electrically connects the first conductive layer and the second conductive layer,
wherein the first radiator plate and the second radiator plate are separated from each other, and the first stacked body and the second stacked body are thermally insulated from each other,
wherein the second semiconductor element has a higher temperature rating limit than a temperature rating limit of the first semiconductor element, and
wherein the first semiconductor element is arranged in an upstream side of the flow path of a cooling medium of the radiator relative to the second semiconductor element.

2. The semiconductor apparatus according to claim 1, wherein a solder that electrically connects the second semiconductor element and the second conductive layer has a higher heat tolerance than a heat tolerance of a solder that electrically connects the first semiconductor element and the first conductive layer.

3. The semiconductor apparatus according to claim 1, wherein a solder that connects the second insulating layer and the second radiator plate has higher heat tolerance than a solder configured to connect the first insulating layer and the first radiator plate.

4. The semiconductor apparatus according to claim 1, wherein a planar dimension of a first area located on the radiator, in which the first radiator plate is mounted, is larger than a planar dimension of a second area located on the radiator, in which the second radiator plate is mounted.

5. The semiconductor apparatus according to claim 1, wherein a mounting position of the first radiator plate with regard to the radiator and a mounting position of the second radiator plate with regard to the radiator are different in a height direction.

6. The semiconductor apparatus according to claim 1, wherein the semiconductor material of the first semiconductor element and the semiconductor material of the second semiconductor element have different temperature rating limits.

7. The semiconductor apparatus according to claim 1, further comprising a heat insulating part disposed between the first stacked body and the second stacked body.

8. The semiconductor apparatus according to claim 1, wherein the first semiconductor element is constituted of an Si semiconductor element, and
wherein the second semiconductor element is constituted of an SiC semiconductor element, a GaN semiconductor element, or a diamond semiconductor element.

9. The semiconductor apparatus according to claim 1, wherein the first semiconductor element is constituted of an IGBT included in an inverter or a convertor, and wherein the second semiconductor element is constituted of a diode forms a pair with the IGBT.

10. The semiconductor apparatus according to claim 9, wherein the inverter or the convertor including the pair of the IGBT and the diode is modularized as a power conversion apparatus.

11. The semiconductor apparatus according to claim 1, wherein the first and second conductive layers are distinct.

12. The semiconductor apparatus according to claim 1, wherein the flow path includes a first portion disposed adjacent the first stacked body and a second portion disposed adjacent the second stacked body, the first and second portions being interconnected.

13. The semiconductor apparatus according to claim 12, wherein coolant flows through the flow path.

14. The semiconductor apparatus according to claim 1, further comprising a heat insulating part disposed between the first stacked body and the second stacked body in contact with the first and second radiator plates and the first and second insulating layers,
wherein the first radiator plate is laterally adjacent to the second radiator plate on a same plane, and
wherein the first radiator plate is wider than the second radiator plate, such that a portion of the first radiator plate extends beneath a portion of the second insulating plate.

15. The semiconductor apparatus according to claim 14, wherein the first and second insulating layers are a same width.

* * * * *